United States Patent

Koyama

[19]

[11] Patent Number: 5,952,837
[45] Date of Patent: Sep. 14, 1999

[54] SCANNING PHOTOINDUCED CURRENT ANALYZER CAPABLE OF DETECTING PHOTOINDUCED CURRENT IN NONBIASED SPECIMEN

[75] Inventor: Tohru Koyama, Hyogo, Japan

[73] Assignee: Mitsubishi Denki Kabushiki Kaisha, Tokyo, Japan

[21] Appl. No.: 08/921,254

[22] Filed: Aug. 29, 1997

Related U.S. Application Data

[62] Division of application No. 08/503,567, Jul. 18, 1995, Pat. No. 5,708,371.

[51] Int. Cl.$^6$ .................................................. G01R 31/26
[52] U.S. Cl. .............................................................. 324/752
[58] Field of Search ...................... 324/71.3, 73.1, 324/158.1, 752, 765, 769, 750; 438/14, 17, 18; 257/40, 48; 356/400, 401; 348/126

[56] References Cited

U.S. PATENT DOCUMENTS

| | | | |
|---|---|---|---|
| 4,736,159 | 4/1988 | Shiragasawa et al. | 324/752 |
| 5,493,236 | 2/1996 | Ishii et al. | 324/752 |
| 5,804,980 | 9/1998 | Nikawa | 324/752 |

FOREIGN PATENT DOCUMENTS 6-300824  10/1994  Japan .

OTHER PUBLICATIONS

"Microscopic Optical Beam Induced Current Measurements and their Applications", Koshi Haraguchi, 1994, IEEE, pp. 693–699. (unavailable month).

"Novel OBIC Observation Method for . . . ", Nikawa et al., The 19th International Symposium for Testing & Failure Analysis, Los Angeles, CA, U.S.A., Nov. 1993, p. 3.
"Tempreature Dependence of Optical Beam Reduced Current (OBREC) Signal in VLSI Metal Interconnection", Kawamura et al.
Extended Abstracts, The 55th Autumn Meeting, 1994, Japan Society of Applied Physics, pp. 49 and 586, published Sep. 19, 1994.
'94 Digital OBIC Scanner Seminar, pp. 23–33, published Nov. 9, 1994.

*Primary Examiner*—Vinh P. Nguyen
*Attorney, Agent, or Firm*—McDermott, Will & Emery

[57] ABSTRACT

A sample to be measured having a semiconductor integrated circuit having interconnection lines is set on a scanning photoinduced current analyzer with one end of the interconnection line being open and the other end connected through a current amplifier to the ground. When a laser beam falls on part having a comparatively low thermal conductivity, such as a part having a void, of the interconnection line while the interconnection line is scanned with the laser beam, temperature distribution in the interconnection line changes at the part. The change in temperature distribution produces spontaneous thermoelectromotive force by the Seebeck effect to induce a current. The current amplifier amplifies the induced current, and then an image date converter converts the amplified current into image information in synchronism with the scanning operation of the laser beam. Since the photoinduced current can be measured without supplying a bias current to the sample to be measured, a current image corresponding to the photoinduced current can be formed to determine the position of a void even if the sample to be measured has a high resistance.

6 Claims, 14 Drawing Sheets

SCANNING PHOTOINDUCED CURRENT ANALYZER CAPABLE OF DETECTING PHOTOINDUCED CURRENT IN NONBIASED SPECIMEN

This application is a division of application Ser. No. 08/503,567 filed Jul. 18, 1995, allowed Jun. 2, 1997, now U.S. Pat. No. 5,708,371.

BACKGROUND OF THE INVENTION

1. Field of the Invention

The present invention relates to a photoinduced current analyzer and, more particularly, to a scanning photoinduced current analyzer capable of detecting photoinduced current without supplying any steady-state current to a measuring object.

2. Description of the Related Art

Generally interconnection lines of a material containing aluminum (Al) as a principal component are used for its low specific resistance and its ease in processing for interconnecting the elements of a semiconductor integrated circuit, such as transistors and resistors. Deterioration of the reliability of Al interconnection lines has become more serious with the progressive miniaturization of semiconductor integrated circuits and increase in interconnection levels of semiconductor integrated circuits. Deterioration of the reliability of Al interconnection lines is attributable to increase in current stresses and mechanical stresses induced in Al interconnection lines.

While the size of Al interconnection lines is on the submicron order, currents that flow through Al interconnection lines are on the order of several hundred microamperes and current density is as high as the order of 105 A/cm$^2$. Mechanical stresses on the order of 100 MPa are induced in interconnection lines when the semiconductor integrated circuit is subjected to heat treatment in the LSI manufacturing process.

Such stresses induced in the interconnection lines cause the migration of Al atoms, electromigration or stress migration, which forms voids in the interconnection lines, and voids increases the resistance of the interconnection lines and, in the worst case, breaks the interconnection lines.

Accordingly, the detection and observation of the density and positions of voids in the interconnection lines are essential to the enhancement of the reliability of Al interconnection lines. A surface potential contrast method is a known method of detecting voids in Al interconnection lines using a SEM (Scanning Electron Microscope) or a FIB apparatus (Focused Ion Beam apparatus). However, the surface potential contrast method must be carried out in a vacuum and is capable of analyzing only exposed interconnection lines and of detecting only completely broken parts in interconnection lines.

For example, an OBIRCH method (Optical Beam Induced Resistance Change Method) disclosed in Proceedings of the 19th International Symposium for Testing & Failure Analysis, pp. 303–310 (1993) is not subject to those restrictions.

FIG. 20 is a block diagram of an apparatus for carrying out the OBIRCH method.

First the operation of the apparatus will be described.

A current is supplied to a sample to be measured 6 from a dc power supply 8, and a current amplifier 10 monitors the current.

A laser scanning microscope focuses a laser beam on the sample to be measured 6, and scans an area specified on the sample to be measured 6 by a signal r provided by a controller 20 with the laser beam.

For example, when the laser scanning microscope is provided with an He—Ne laser that emits laser light of 633 nm in wavelength, the laser beam can be focused on the sample to be measured 6 in a spot of about 0.5 μm in diameter.

An image information converter 12 receives a laser beam scanning position signal 1 from the controller 20 and a signal i corresponding to a current flowing through the sample to be measured 6. The image information converter 12 provides image information corresponding to the signal i at each scanning position, such as a signal b representing luminance corresponding to the current signal i, and then an image output unit 14 provides an image corresponding to the signal b.

FIG. 21 is a diagrammatic view of the sample to be measured 6. Since the OBIRCH method needs to supply a current to the sample to be measured 6 as mentioned above, the measuring interconnection lines must be formed in a measuring pattern comprising a interconnection pattern 16 and terminal pads 18.

FIG. 22 is a block diagram of the laser scanning microscope 2. A laser beam 4 emitted by a laser light source 100 falls on an optical deflector 102. The optical deflector 102 deflects the laser beam 4 by an angle specified by the signal r provided by the controller 20. A focusing unit 106 focuses the laser beam 4 on the sample to be measured 6.

Since the position of the spot of the focused laser beam 4 on the sample to be measured 6 is dependent on the deflection angle, the laser beam 4 is deflected according to the signal r for scanning. In the laser scanning microscope 2 shown in FIG. 22, the focusing unit 106 comprises a reflecting mirror 58 and an objective lens 56.

An image forming unit 104 is disposed on an optical path along which the laser beam 4 travels to form an image by focusing the reflected light reflected by the sample to be measured 6 and to provide an image signal v. In this example, a beam splitter 50 reflects part of the reflected light and an image forming lens 52 forms an image on a photodetector 54. The photodetector 54 may be, for example, a linear CCD (Charge-Coupled Device). The photodetector 54 provides the image signal v.

The image information converter 12 receives the image signal v. The image information converter 12 provides either the image information signal b or the image signal v according to the control signal 1 provided by the controller 20.

The void detecting principle of this apparatus for detecting a void formed in an interconnection line 16, such as an Al interconnection line, will be described hereinafter with reference to FIG. 23.

Suppose that, in a reference state, the laser beam is projected on a region P in which no void is found in the Al interconnection line. When the laser beam falls in a region Q in which voids are formed, heat is transferred at a reduced rate. Therefore, a temperature rise $\Delta T_Q$ in the region Q when irradiated with the laser beam is greater than a temperature rise $\Delta T_P$ in the region P when irradiated with the laser beam and, consequently, the range of variation of resistance is wider when the region Q is irradiated with the laser beam than that when the region P is irradiated with the laser beam. Therefore, the regions P and Q differ from each other in current change $\Delta I$ detected by monitoring the current I flowing through the interconnection line, an output image which enables the determination of the position of a void can be obtained by giving image information obtained by converting the current change ΔI at a scanning position into corresponding luminance data to the image output unit 14, such as a CRT.

The position of the void in the Al interconnection line 16 can be determined through the comparison of the output image with an image output based on the image formation data provided by the laser scanning microscope 2.

Since this method determines the change (increase) in the resistance of the region having the void due to heat generation from change (reduction) in the current flowing through the sample to be measured 6 and forms an image, a voltage must be applied to the interconnection line to supply a current on the order of several milliamperes for analysis. Accordingly, sample to be measured having a high resistance of about 10 kΩ or above cannot be analyzed and the method is subject to restriction on the resistance of the sample to be measured. Since it is difficult to apply a voltage to a desired interconnection line of a device, such as an LSI circuit, to supply a current to the desired interconnection line, it is scarcely possible to apply this method to the analysis of practical devices.

SUMMARY OF THE INVENTION

Accordingly, it is an object of the present invention to provide a scanning photoinduced current analyzer capable of obtaining image information representing a photoinduced current induced in a sample to be measured without supplying any bias current to the sample to be measured.

Another object of the present invention is to provide a scanning photoinduced current analyzer capable of detecting the positions of voids and defects in a sample to be measured without being subject to restriction on the resistance of the sample to be measured.

A further object of the present invention is to provide a scanning photoinduced current analyzer not subject to restrictions on the shape of the sample to be measured, particularly, a restriction that the sample to be measured should form a closed circuit.

Briefly, a scanning photoinduced current analyzer in accordance with the present invention is capable of detecting a photoinduced current induced in a sample to be measured by scanning the sample to be measured with a focused laser beam and comprises a laser light source, a luminous flux scanner, a focusing device, a controller, a current amplifier, an image converter and an image output device.

The laser light source emits a measuring laser beam. The luminous flux scanner scans a laser beam in a region according to a first control signal. The focusing device focuses the laser beam on a sample to be measured. The controller provides the first control signal. The current amplifier is connected to the opposite ends of the sample to be measured, amplifies the current flowing through the sample to be measured and provides an output signal corresponding to the amplified current. The image converter converts the output signal of the current amplifier into image information in synchronism with the scanning operation of the laser beam. The image output device provides an image corresponding to the image information.

In another aspect of the present invention, a scanning photoinduced current analyzer comprises a laser light source, a luminous flux scanner, a focusing device, a controller, a current amplifier, an image forming device, an image converter and an image output device. The laser light source emits a laser beam. The luminous flux scanner scans a laser beam in a region according to a first control signal. The focusing device focuses the laser beam on a sample to be measured. The current amplifier is connected to the opposite ends of the sample to be measured, amplifies the current flowing through the sample to be measured and provides an output signal corresponding to an amplified current. The image forming device forms an image by focusing the reflected light from the sample to be measured and provides an image formation data. The image converter comprises a means for converting the output signal of the current amplifier into corresponding image information in synchronism with the scanning operation of the laser beam and providing the image information, and a switching means for selecting a first state in which the image information is provided according to a second control signal or a second state in which the image formation data is provided. The controller provides the first and the second control signal.

In a third aspect of the present invention, a scanning photoinduced current analyzer comprises a laser light source, a luminous flux scanner, a focusing device, a controller, a first power supply, a current amplifier, an image converter and an image output device. The laser light source emits a laser beam. The luminous scanner scans the laser beam in a region specified by a first control signal. The focusing device focuses the laser beam on a sample to be measured. The controller provides a first control signal. The current amplifier to one end of the sample to be measured having the electrically open other end and the first power supply, amplifies the current flowing through the sample to be measured and provides a signal corresponding to the amplified current. The image converter converts the output signal of the current amplifier into corresponding image information in synchronism with the scanning operation of the laser beam and provides the image information. The image output device provides an image corresponding to the image information.

Thus, principal advantages of the present invention are capability of detecting the positions of voids and the like in a sample to be measured without supplying a bias current to the sample to be measured and capability of detecting the positions of voids in the virtually broken interconnection lines and the like of a semiconductor integrated circuit.

Other advantage of the present invention is capability of measuring any sample to be measured having any pattern other than a special pattern, such as a practical semiconductor device because the sample to be measured need not form a closed circuit for measurement.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13(a), 13(b) and 13(c) are views of assistance in explaining the operation of the ninth embodiment, in which FIG. 13(a) is a sectional view of a sample to be measured placed in a scanning region, FIG. 13(b) is a diagram showing temperature distribution in an Al interconnection line when the Al interconnection line is scanned with a laser beam at a low scanning speed, and FIG. 13(c) is a diagram showing temperature distribution in an Al interconnection line when the Al interconnection line is scanned with a laser beam at a high scanning speed;

FIGS. 19(a) and 19(b) are pictorial views of assistance in explaining the operation of the thirteenth embodiment, in which FIG. 19(a) is a pictorial view of an image for specifying a current detecting region and FIG. 19(b) is a pictorial view of a current image corresponding to a current detected by scanning a specified current detecting region;

DESCRIPTION OF THE PREFERRED EMBODIMENTS

Figure 1:
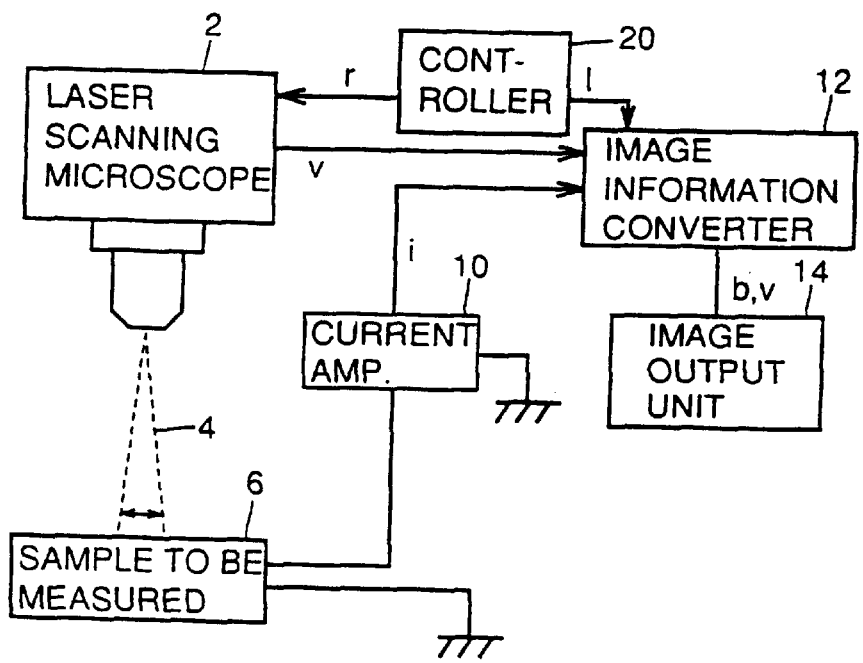
FIG. 1 is a block diagram of a scanning photoinduced current analyzer in a first embodiment according to the present invention.

FIG. 1 is a block diagram of a scanning photoinduced current analyzer in a first embodiment according to the present invention.

Figure 20:
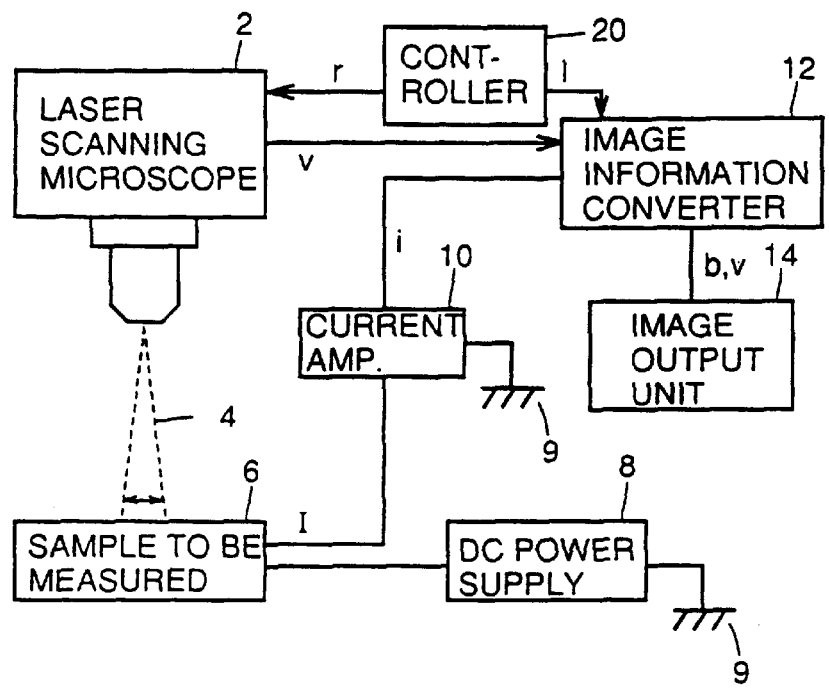
FIG. 20 is a block diagram of a prior art scanning photoinduced current analyzer.
Figure 21:
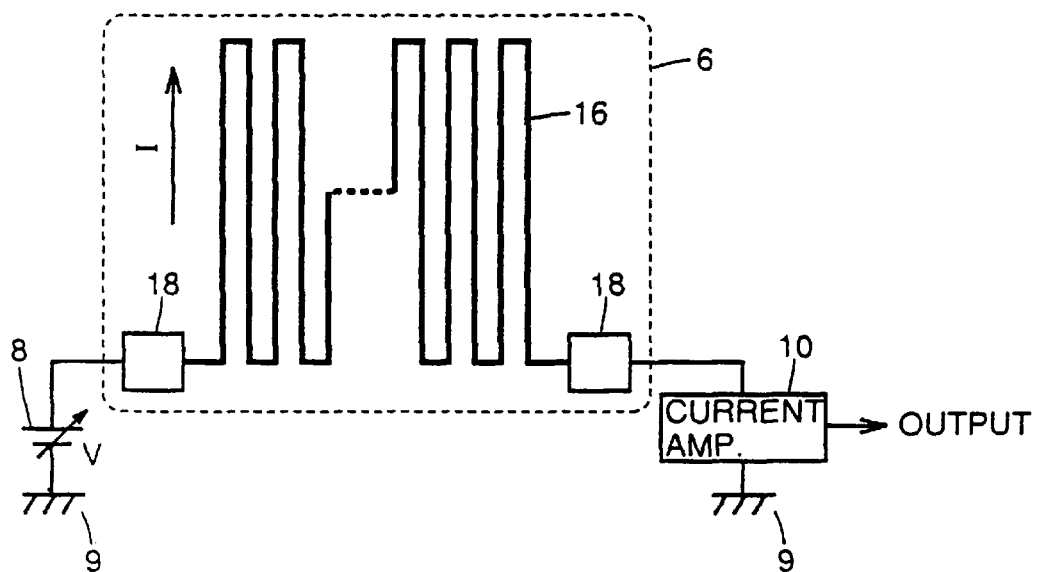
FIG. 21 is a diagrammatic view of an essential part of the scanning photoinduced current analyzer of FIG. 20, in which a sample to be measured is place.

The first embodiment differs from the prior art scanning photoinduced current analyzer of FIG. 20 in that the first embodiment is not provided with any dc power supply corresponding to the dc power supply 8 of the prior art scanning photoinduced current analyzer, and the first embodiment connects one end of a sample to be measured 6 to the ground and connects the other end of the same through a current amplifier 10 to the ground.

Figure 2:
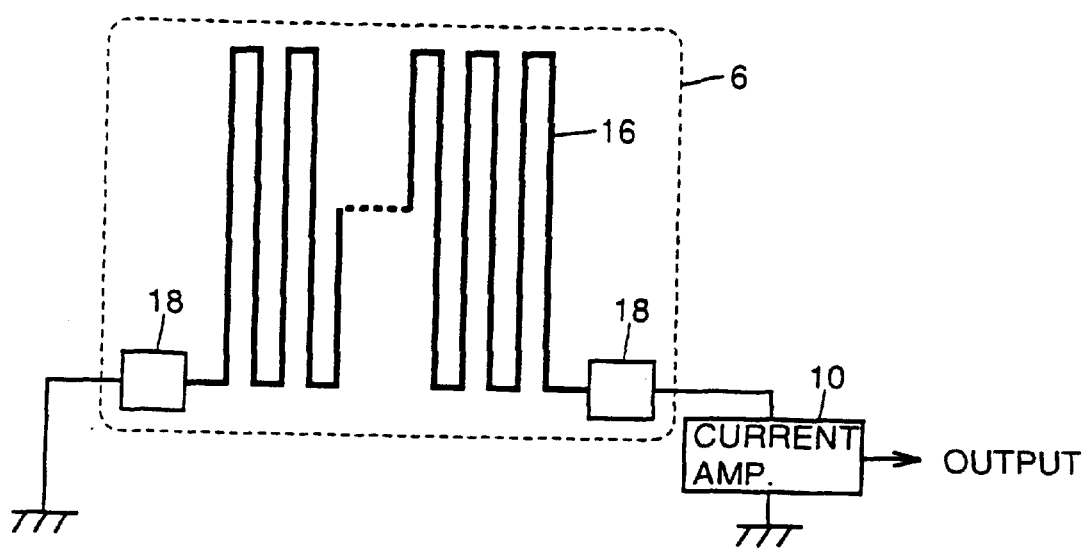
FIG. 2 is a diagrammatic view of an essential part of the first embodiment, in which a sample to be measured is placed.

FIG. 2 shows the relation of a sample to be measured 6 with a ground potential and the current amplifier 10.

A measuring pattern to be measured by the scanning photoinduced current analyzer in the first embodiment is formed in a special measuring pattern of an interconnection pattern 16 and terminal pads 18.

One of the terminal pads 18 is grounded and the other terminal pad 18 is connected to the current amplifier 10.

A sample to be measured 6 is scanned with a laser beam to obtain a current image without applying any voltage to the sample to be measured 6 and without supplying any current to the sample to be measured 6. The scanning photoinduced current analyzer is provided with a laser that emits a laser beam 4 of about 0.7 mW as measured on the sample to be measured 6, and the current amplifier 10 of 40 pA in detection limit current. When the laser beam 4 of about 0.7 mW in power was used, the current amplifier 10 of 1 nA or below in detection limit current could detect voids under a nonbiased condition.

Figure 3A:
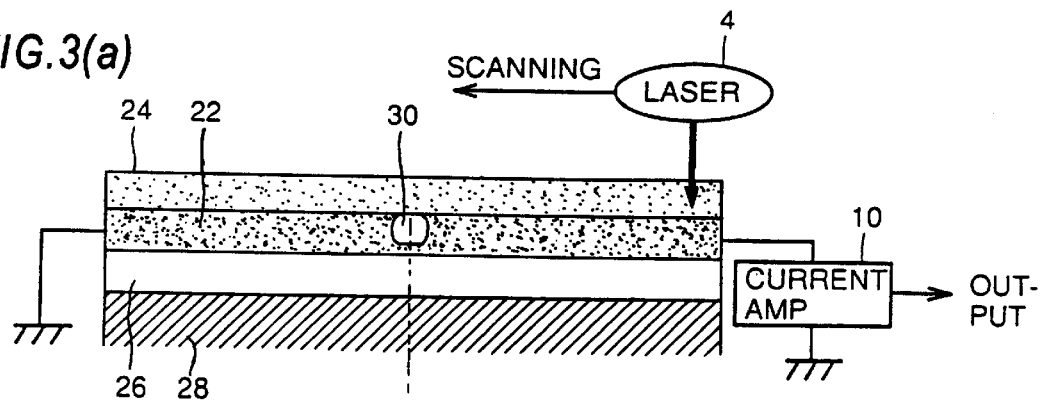
FIGS. 3(*a*), 3(*b*) and 3(*c*) are views of assistance in explaining the operation of the first embodiment, in which FIG. 3(*a*) is a sectional view of a sample to be measured placed in a scanning region, FIG. 3(*b*) is a graph showing the variation of current measured during scanning with a laser beam, and FIG. 3(*c*) is a pictorial view of an image corresponding to the waveform of the current shown in FIG. 3(*b*)
Figure 3B:
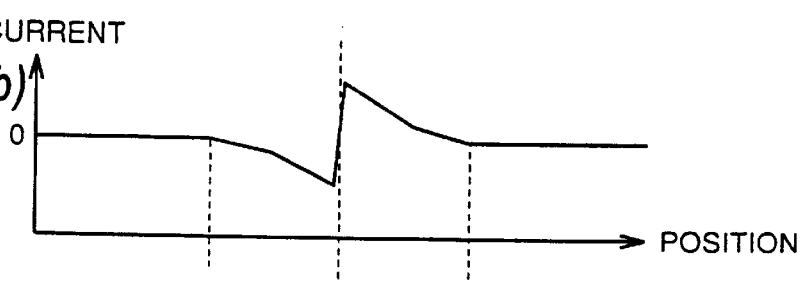
Figure 3C:
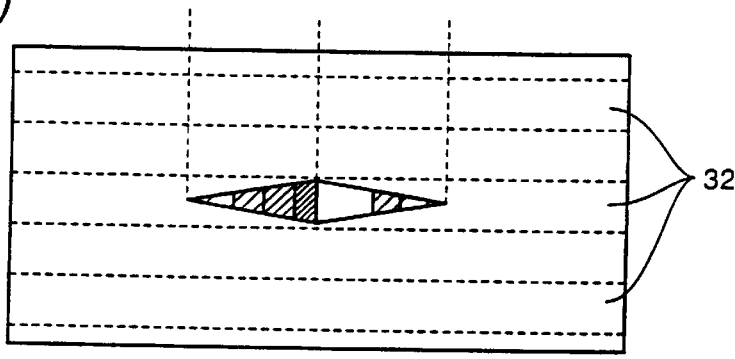

FIG. 3(a) is a sectional view of the sample to be measured including an Al interconnection line 22, FIG. 3(b) is a graph showing the variation of the current detected by the current amplifier 10 with the position of the spot of a laser beam on the Al interconnection line 22 when the sample to be measured 6 is scanned with the laser beam 4, and FIG. 3(c) shows a current image corresponding to the current shown in FIG. 3(b) and provided by an image output device 14.

The Al interconnection line 22 is formed by patterning a single-layer film of Al or a material containing Si or Cu, or a multilayer film formed by sandwiching an Al film between TiN or W films or by overlaying or underlaying an Al film with a TiN or W film. A passivation film 24 and a layer insulating film 26 is formed of SiN, SiO2 or such.

As shown in FIG. 3(b), when the Al interconnection line 22 formed on a silicon substrate 28 is scanned with a laser beam 4, the direction of a current induced in the Al interconnection line 22 changes when the spot of the laser beam 4 passes a position corresponding to a void 30 formed in the Al interconnection line 22, and the absolute value of the current increases as the spot of the laser beam 4 approaches the position corresponding to the void 30. Consequently, a characteristic current image having a dark section and a bright section demarcated by a line corresponding to the position of the void 30 as shown in FIG. 3(*c*) is formed. In FIG. 3(*c*) areas indicated by dotted lines are Al interconnection lines 32. The current image is considered to correspond to a current generated by spontaneous thermoelectromotive force produced by the Seebeck effect. Thus, the void detecting principle of the present invention is completely different from the void detecting principle of the prior art scanning photoinduced current analyzer.

When the sample to be measured is kept at the ground potential, the measuring system need not be provided with any dc power supply corresponding to the dc power supply 8 included in the prior art scanning photoinduced current analyzer, measurement is not affected by noise generated by a dc power supply and hence a sharp current image can be formed for the detection of a void at an enhanced sensitivity.

Figure 4:
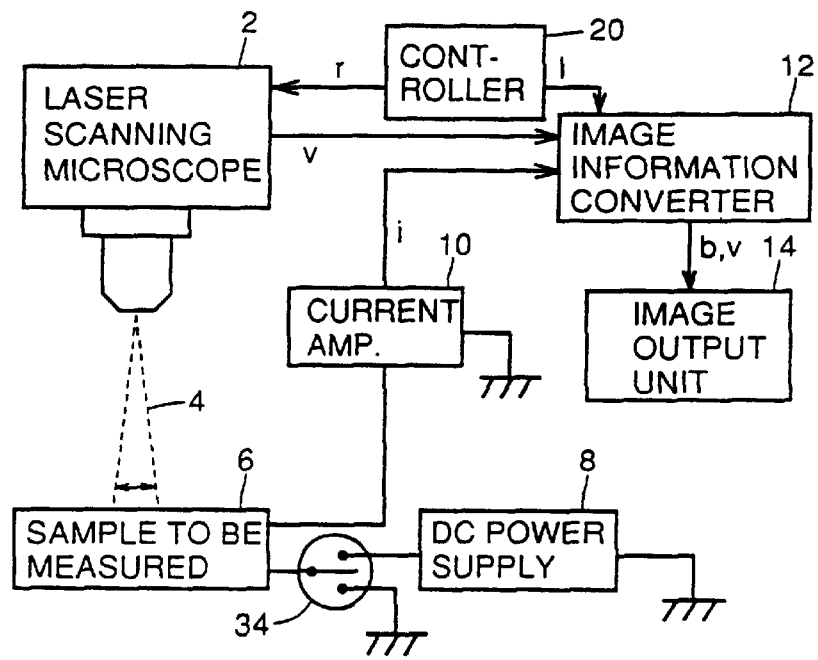
FIG. 4 is a block diagram of a scanning photoinduced current analyzer in a second embodiment according to the present invention.

FIG. 4 is a block diagram of a scanning photoinduced current analyzer in a second embodiment according to the present invention.

This scanning photoinduced current analyzer is provided with a switch 34 for selectively connecting one of the terminal electrode of the sample to be measured directly to a ground or through a dc power supply 8 indirectly to the ground. In FIG. 4, components 2 to 20 are the same as those of the scanning photoinduced current analyzer of FIG. 1. Thus, a photoinduced current induced in the sample to be measured can be measured with a bias voltage applied to the sample to be measured as well as with no bias voltage applied to the same.

Figure 5:
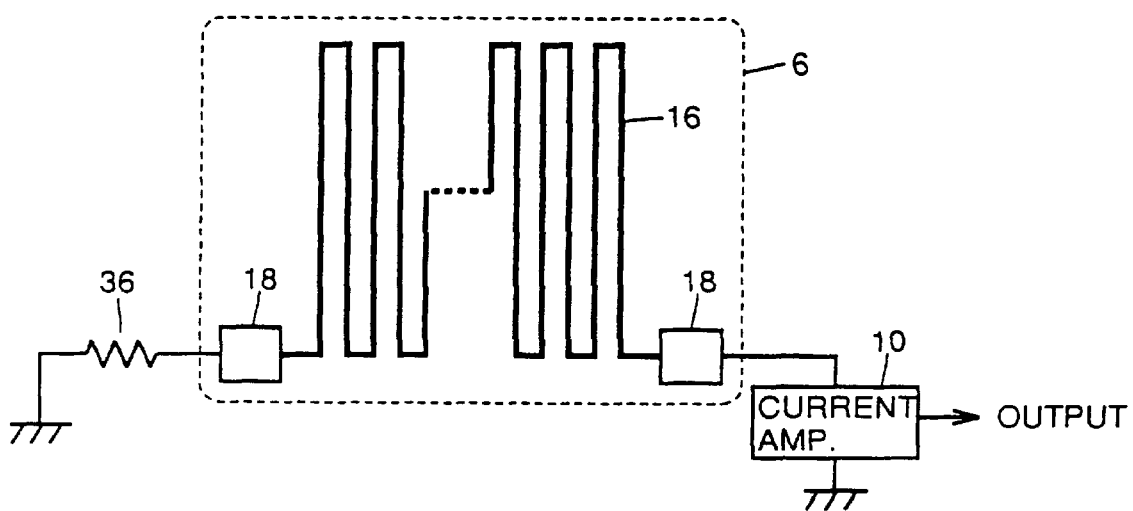
FIG. 5 is diagrammatic view of an essential part of a scanning photoinduced current analyzer in a third embodiment according to the present invention, in which a sample to be measured is placed.
Figure 6:
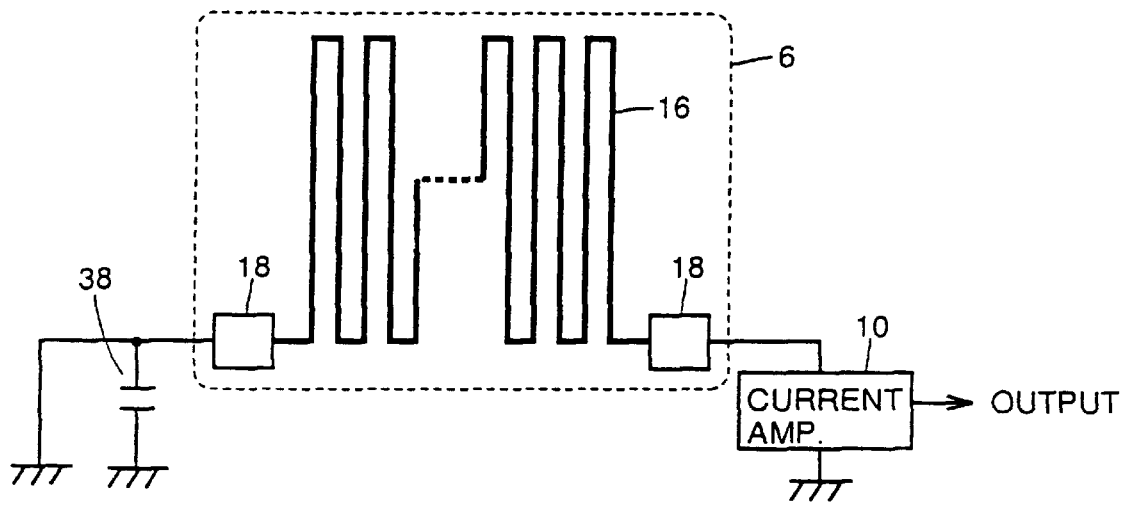
FIG. 6 is a diagrammatic view of an essential part of a scanning photoinduced current analyzer in a fourth embodiment according to the present invention, in which a sample to be measured is placed.

In a third embodiment, a resistor 36 is interposed between one of the terminal pad 18 and a grounding node as shown in FIG. 5. In a fourth embodiment, a capacitor 38 is interposed between one of the terminal pads 18 and a grounding node as shown in FIG. 6. In FIGS. 5 and 6, components 6 to 18 are the same as those of the scanning photoinduced current analyzer shown in FIG. 2. The resistor 36 and the capacitor 38 thus incorporated into the scanning photoinduced current analyzers further reduced noise and the scanning photoinduced current analyzer could form further sharp current images and could detect voids at an improved detection sensitivity. In a modification, both a resistor 36 and a capacitor 38 may be interposed between one of the terminal pads 18 and the grounding node for the same effect.

When low-frequency electromagnetic waves propagate in the measuring space and introduce noise into the output signal of the current amplifier 10, the resistor 36 converts the noise into Joul heat and the capacitor 38 converts the noise into a dielectric loss, whereby the low-frequency waves are absorbed to reduce the noise effectively.

The capacitor 38 is also capable of eliminating high-frequency noise.

Figure 7:
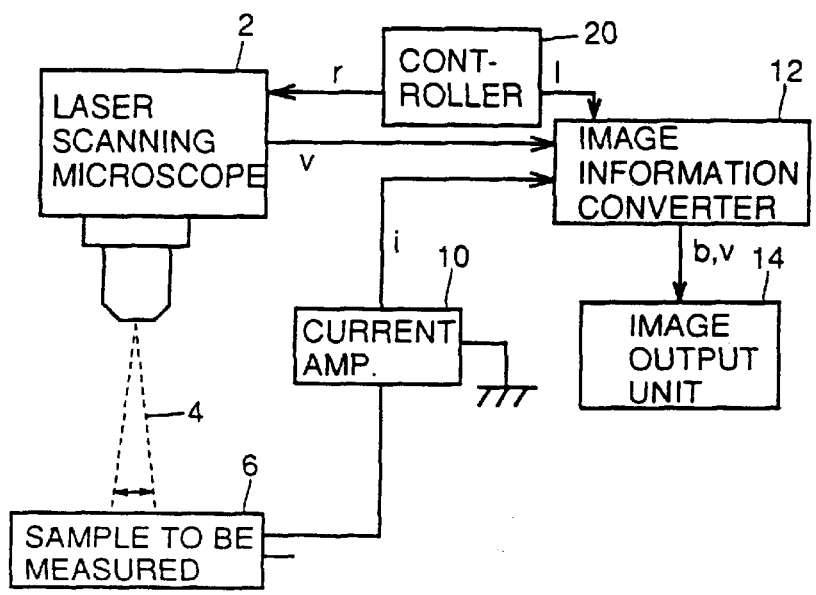
FIG. 7 is a block diagram of a scanning photoinduced current analyzer in a fifth embodiment according to the present invention.

One of the terminal pads 18 may be left open instead of connecting the same to the ground potential; that is, the measuring system need not be a closed circuit. FIG. 7 shows a scanning photoinduced current analyzer in a fifth embodiment according to the present invention, in which components 2 to 20 are the same as those of the scanning photoinduced current analyzer of FIG. 1, and one of the terminal pads of a sample to be measured is left open. The measurement of the photoinduced current is possible even if the terminal pad is left open because a current generated when the spot of a laser beam scans a position corresponding to a void is an unbalanced current generated by spontaneous thermoelectromotive force. Since the scanning photoinduced current analyzer, similarly to that in the first embodiment, is not affected by noise, a sharp current image can be formed and voids can be detected at a high detection sensitivity.

Figure 8:
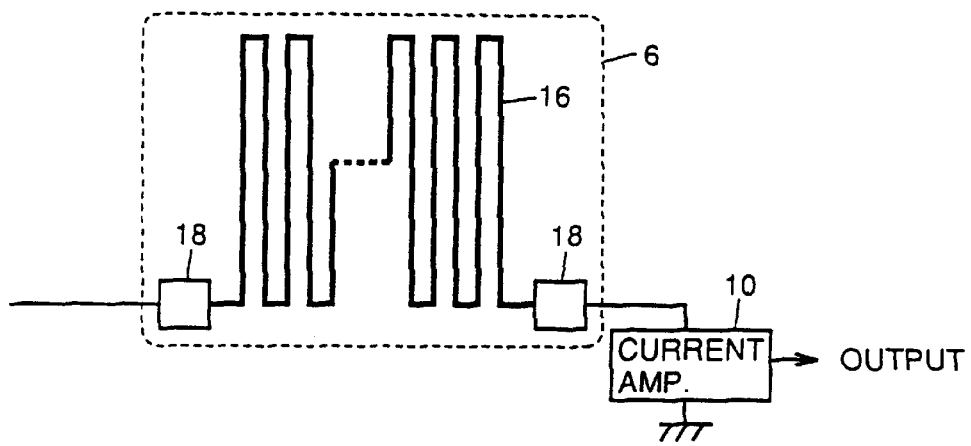
FIG. 8 is a diagrammatic view of an essential part of the fifth embodiment, in which a sample to be measured is placed.

FIG. 8 is a diagrammatic view showing the connection of a sample to be measured 6, the current amplifier 10 and a ground in the fifth embodiment. Since this configuration is capable of detecting a void, the wiring pattern of the sample to be measured 6 need not be a special measuring pattern, provided that at least one end of the wiring pattern can be connected to a current probe. Thus, the scanning photoinduced current analyzer can be applied to the detection of voids in a practical semiconductor integrated circuit.

Figure 9:
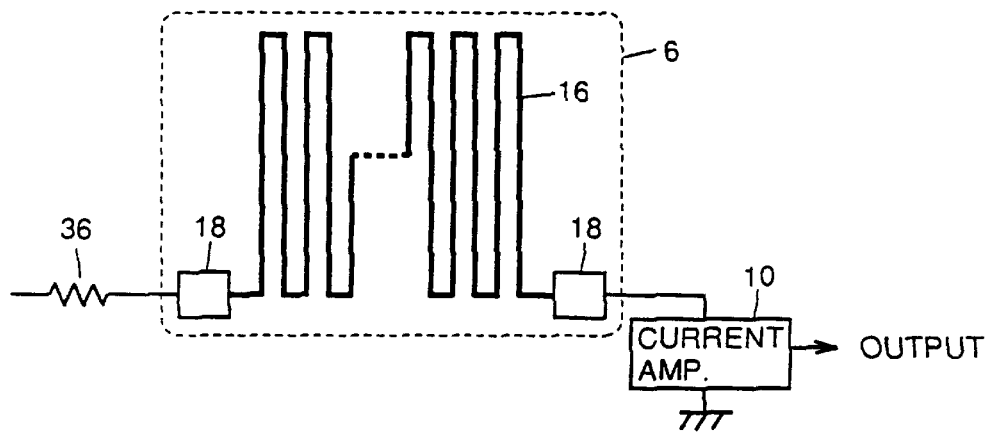
FIG. 9 is a diagrammatic view of an essential part of a scanning photoinduced current analyzer in a sixth embodiment according to the present invention, in which a sample to be measured is placed.
Figure 10:
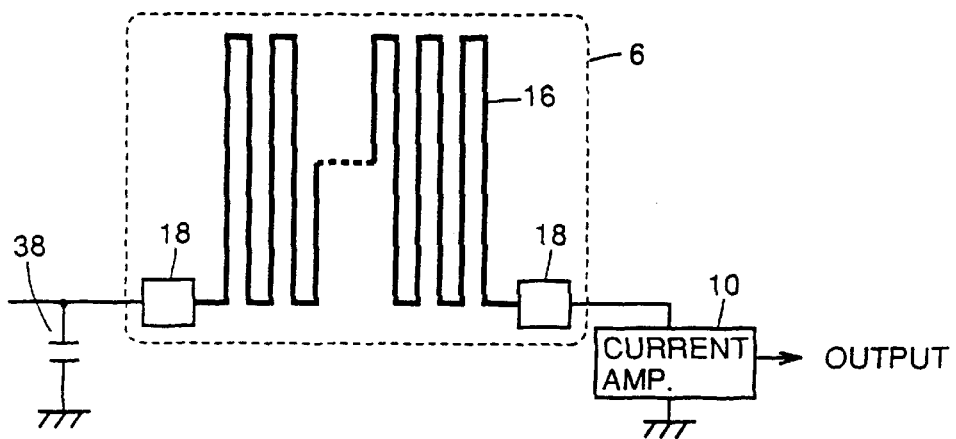
FIG. 10 is a diagrammatic view of an essential part of a scanning photoinduced current analyzer in a seventh embodiment according to the present invention, in which a sample to be measured is placed.

While the fifth embodiment measures the sample to be measured 6 with one of the terminal pads of the wiring pattern of the sample to be measured 6 left open, the resistor 36 and the capacitor 38 may be connected as shown in FIGS. 9 and 10. A scanning photoinduced current analyzer in a sixth embodiment according to the present invention connects a resistor 36 to one of the terminal pads 18 as shown in FIG. 9. A scanning photoinduced current analyzer in a seventh embodiment according to the present invention connects a capacitor 38 to one of the terminal pads 18 as shown in FIG. 10. In FIGS. 9 and 10, components 6 to 18 are the same as those shown in FIG. 2. The resistor 36 and the capacitor 38 reduce the influence of variation of space charge and floating charge and suppress noise. Thus, a sharp current image can be formed and voids can be detected at a high detection sensitivity. The scanning photoinduced current analyzer may be provided with both the resistor 36 and the capacitor 38 for the same noise suppressing effect.

Figure 11:
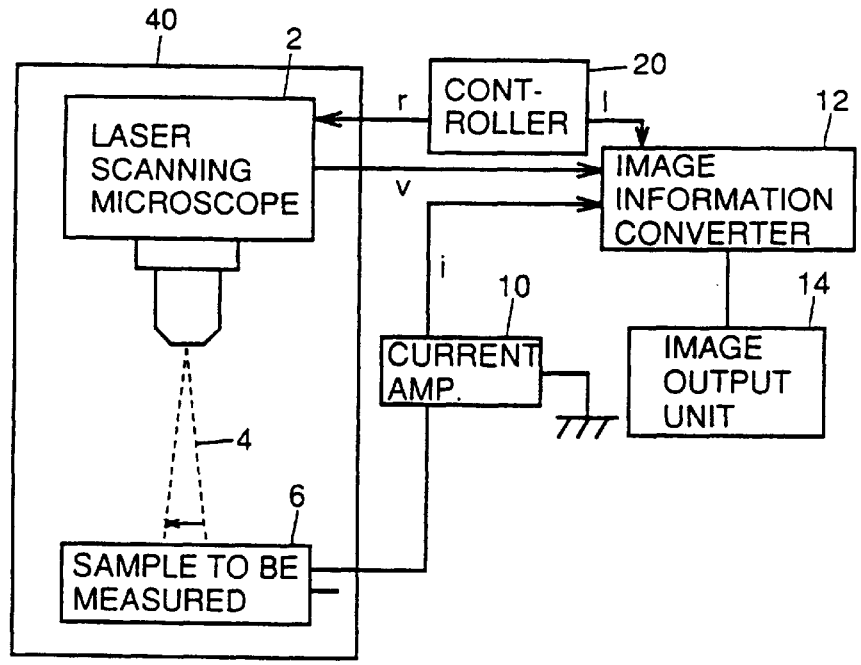
FIG. 11 is a block diagram of a scanning photoinduced current analyzer in a eighth embodiment according to the present invention.

A scanning photoinduced current analyzer in an eighth embodiment according to the present invention shown in FIG. 11 is provided with an electromagnetic shielding member for covering a sample to be measured 6 to suppress noise instead of the resistor 36 or the capacitor 38 connected to one of the terminal pads of the sample to be measured. In FIG. 11 showing the scanning photoinduced current analyzer in the eighth embodiment in a block diagram, components 2 to 20 are the same as those shown in FIG. 1. A laser scanning microscope 2 and a sample to be measured 6 are covered with an electromagnetic shielding member 40 of an alloy, such as Permalloy, a metal or the like. When the sample to be measured 6 is covered with the electromagnetic shielding member 40, the influence of variation of space charge and floating charge on measurement is reduced and noise can be reduced.

Although one of the terminal pads of the sample to be measured 6 is left open in this embodiment, it may be connected to a ground, or through a resistor 36 or a capacitor 38 to a ground for the same noise suppressing effect.

In the first to the eighth embodiment, the SNR (Signal-to-Noise Ratio) is improved by reducing noise to form a sharp current image and to detect voids at an improved detection sensitivity. The SNR can be improved as well by enhancing the current induced when the laser beam scans a position corresponding to a void as by reducing noise.

Figure 12:
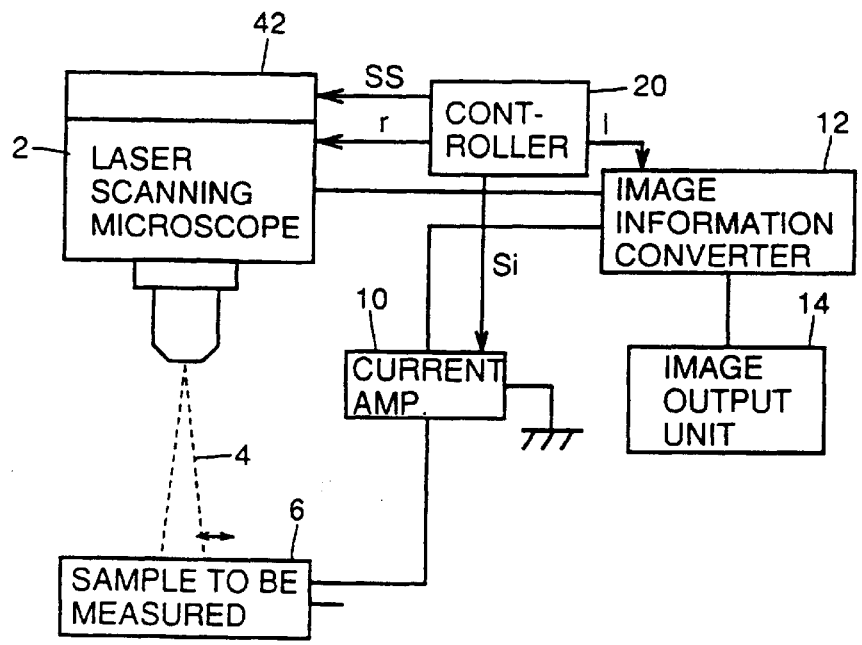
FIG. 12 is a block diagram of a scanning photoinduced current analyzer in a ninth embodiment according to the present invention.

A scanning photoinduced current analyzer in a ninth embodiment according to the present invention shown in FIG. 12 enhances the induced current to improve the SNR.

This scanning photoinduced current analyzer differs from the scanning photoinduced current analyzer in the first embodiment in that a controller 20 gives a scanning speed control signal ss to a scanning speed controller 42 for controlling the scanning speed of a laser beam to control the scanning speed of the laser beam and provides a signal si to control the sampling rate of a current amplifier 10.

Figure 22:
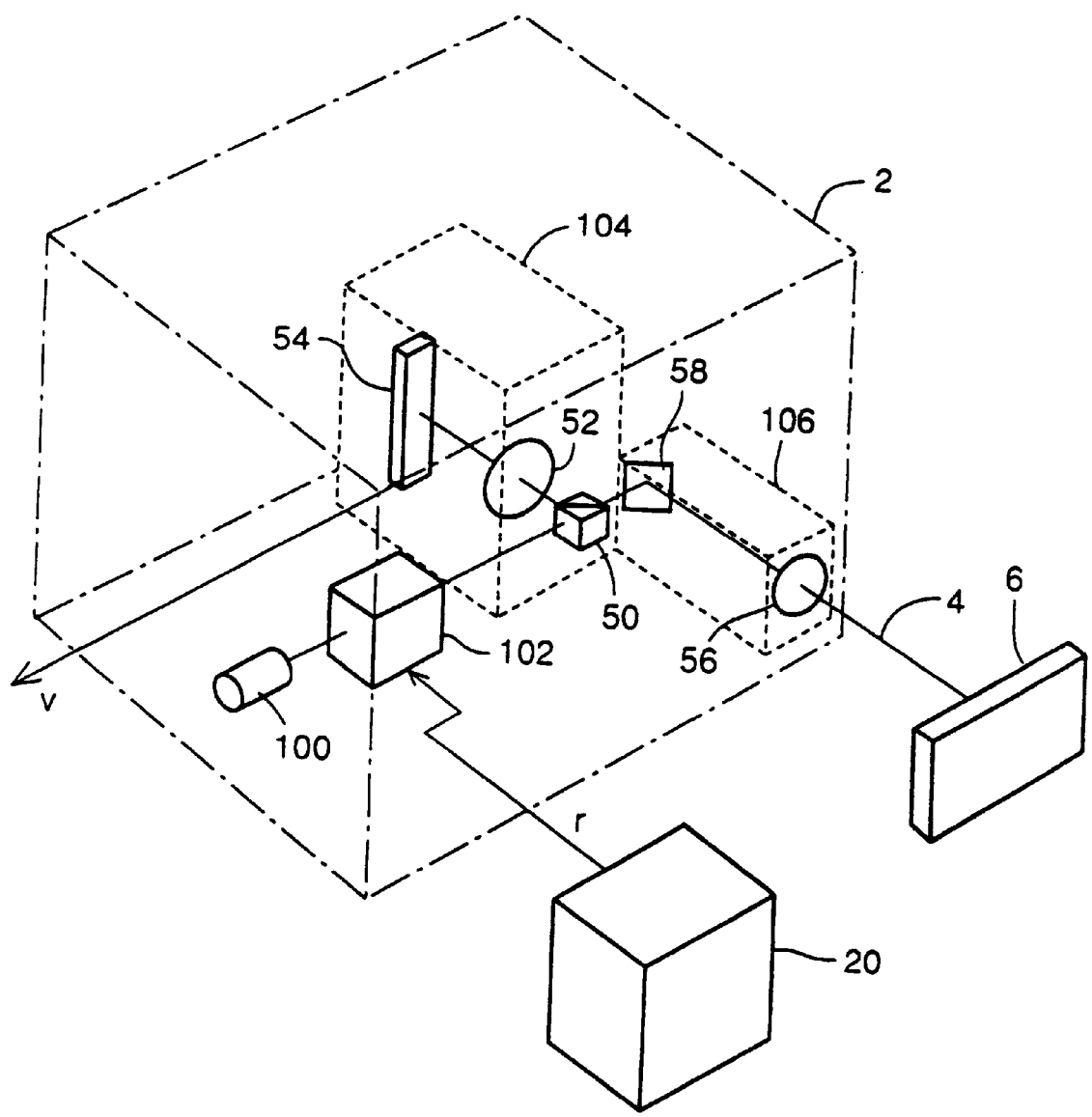
FIG. 22 is a schematic perspective view of a conventional laser scanning microscope.
Figure 23:
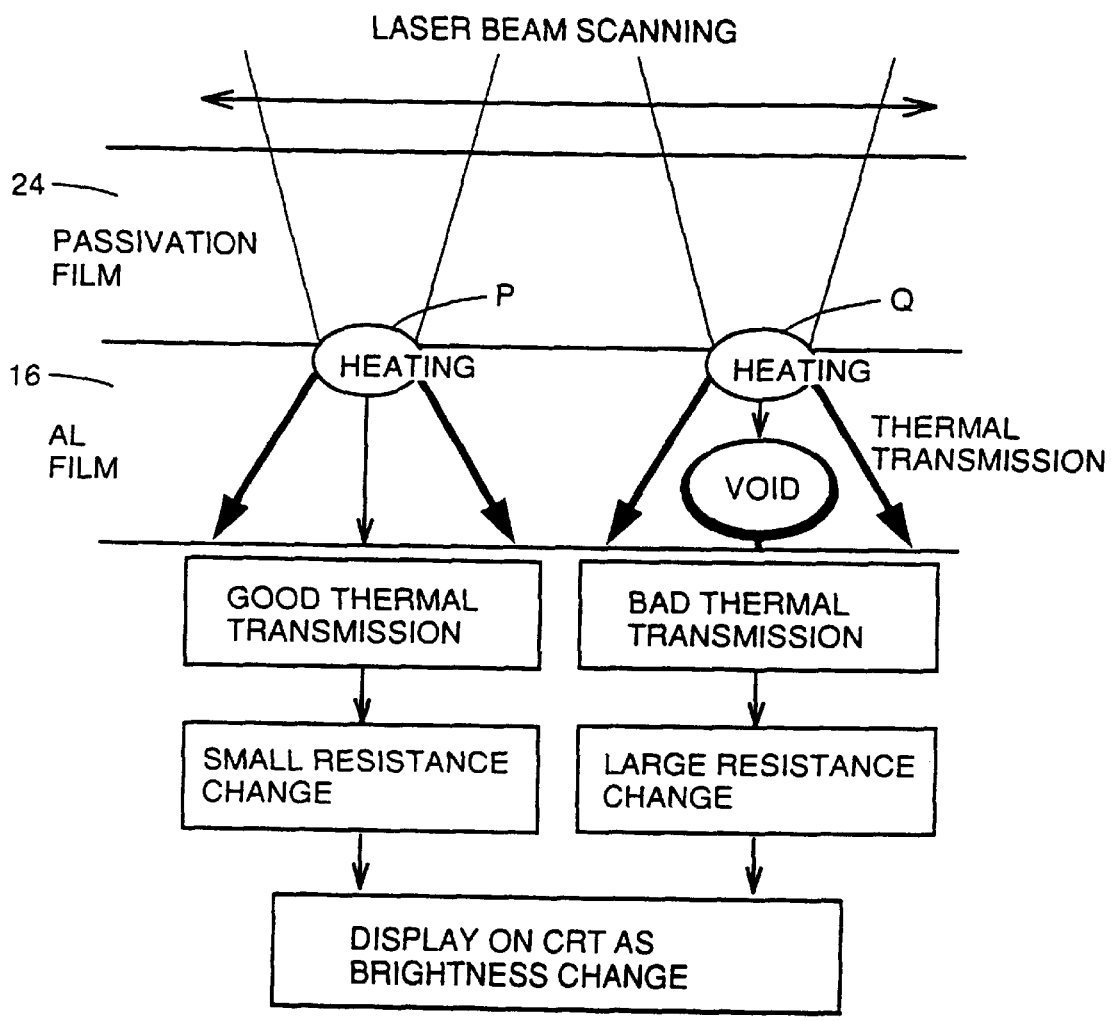
FIG. 23 is a diagrammatic view of assistance in explaining the void detecting principle of the prior art scanning photoinduced current analyzer of FIG. 20.

For example, when the laser beam scanner 102 of the laser scanning microscope shown in FIG. 22 comprises an acoustooptic deflector, the rate of change of the deflecting angle can be varied and hence the scanning speed of the laser beam can be varied when the rate of variation of the frequency of a high-frequency limiting signal applied to the acoustooptic deflector is controlled on the basis of the scanning speed control signal ss.

In the scanning photoinduced current analyzer in the ninth embodiment, the scanning speed of the laser beam is 33 msec per frame or below (thirty frames per second or above), and current sampling rate is increased according to scanning speed, i.e., the scanning speed of the laser beam is increased so that scanning time per frame is 33 msec or below. According to the present invention utilizing the electromotive force generated in a part having a void of a sample to be measured, the current that is induced when the spot of the laser beam scans a part the sample to be measured having the void can be increased by increasing the scanning speed of the laser beam because the induction of current is due to the thermal resistance of the part having the void when the spot of the laser beam scans the part of the sample to be measured having the void.

Figure 13A:
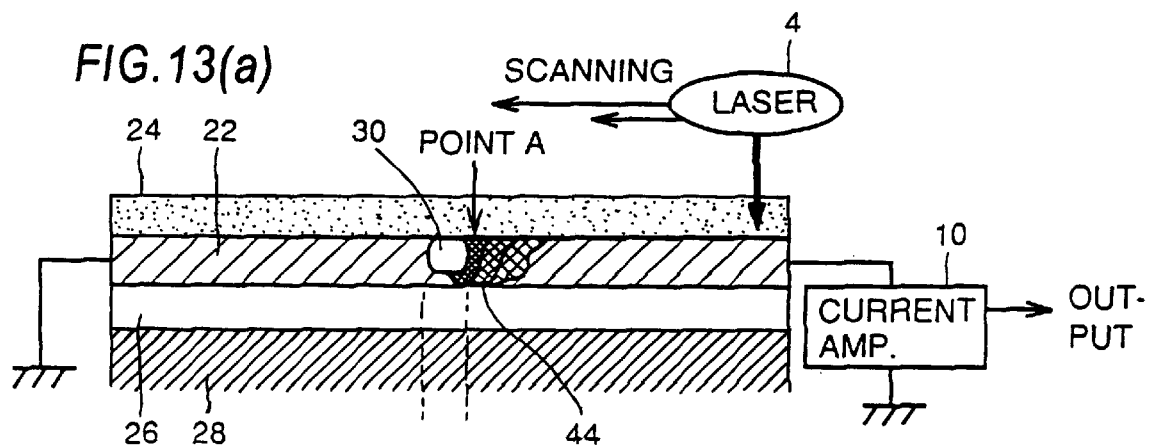
Figure 13B:
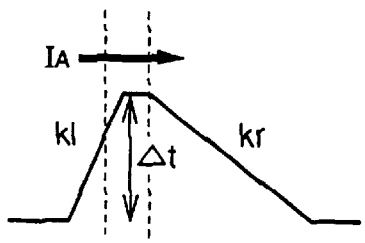
Figure 13C:
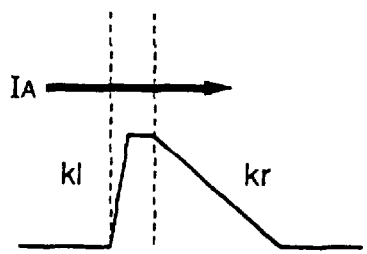

FIGS. 13(a), 13(b) and 13(c) are views of assistance in explaining the reason that the current can be increased by enhancing the scanning speed, in which FIG. 13(a) is a sectional view of a sample to be measured having Al interconnection lines, and FIG. 13(b) is a diagram showing temperature distribution in part of the Al interconnection line 22 around a void 30 when the laser beam moving at a comparatively low scanning speed falls at a point A on the sample to be measured and 13(c) is a diagram showing temperature distribution in the part of the Al interconnection line 22 around the void 30 when the laser beam moving at a comparatively high scanning speed falls at the point A on the sample to be measured. In FIGS. 13(a), 13(b) and 13(c), reference numerals 4 to 30 designate parts like or corresponding to those shown in FIG. 3. The density of hatches in a hatched region 44 represents the temperature distribution; that is, a higher density of hatches represents a higher temperature. A current IA is induced in the part corresponding to the point A at which the laser beam 4 falls on the sample to be measured by the thermoelectromotive force due to the difference between temperature gradients kr and kl on the right side and the left side, respectively, of the point A.

The heat conductivities of the void 30 and the part around the void 30 are lower than that of the normal part of the Al interconnection line 22 and the thermal resistances of the same are higher than that of the normal part of the Al interconnection line 22. Therefore, when the laser beam falls at the point A near the void 30 as shown in FIG. 13(a), the temperature gradient kl in the part on the side of the void 30 with respect to the point A is greater than the temperature gradient kr in the part on the other side of the point A and, consequently, electrons flows to the left to induce the current IA. The induced current IA is dependent on the difference between the temperature gradients kr and kl, and the greater the difference, the higher is the current IA. Since the difference between the temperature gradients kr and kl is dependent on the difference in thermal conductivity between the parts on the opposite sides of the point A, the higher the scanning speed, the greater is the difference between the thermal conductivities kr and kl, and, consequently, the higher is the current IA.

Thus, the SNR of the output signal of the current amplifier 10 can be improved and a sharp current image can be formed by enhancing the scanning speed.

The ninth embodiment enhances the current induced when the laser beam falls at a position corresponding to the void by moving the laser beam at an increased scanning speed to increase the difference between the temperature gradients in the parts on the opposite sides of the position where the laser beam falls. It is also possible to increase the current by cooling the sample to be measured 6 to enhance the thermoelectromotive force.

Figure 14:
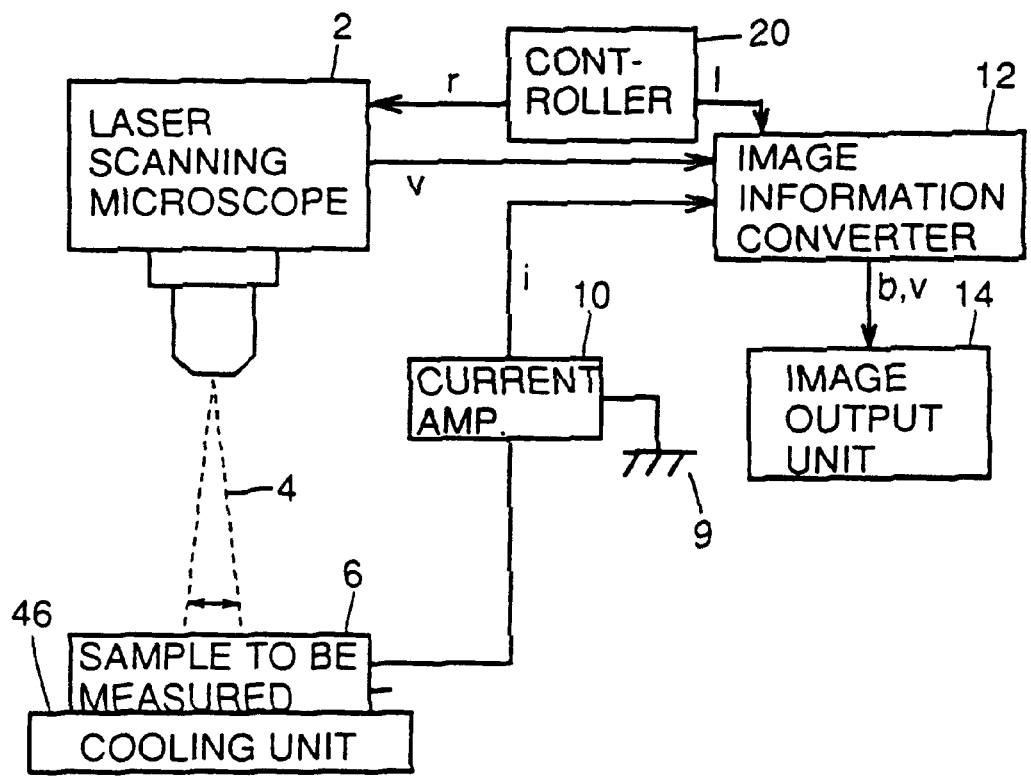
FIG. 14 is a block diagram of a scanning photoinduced current analyzer in a tenth embodiment according to the present invention.

FIG. 14 is a block diagram of a scanning photoinduced current analyzer in a tenth embodiment according to the present invention, in which components 2 to 20 are the same as those of the scanning photoinduced current analyzer shown in FIG. 1. This scanning photoinduced current analyzer is provided additionally with a cooling unit 46 for cooling a sample to be measured 6. The cooling unit 46 may be such as using a liquefied gas, such as liquid nitrogen or liquid helium or an electronic cooling unit utilizing the Peltier effect. It was confirmed through experiments that an increased current corresponding to the void can be induced and the void detection sensitivity can be enhanced by cooling the sample to be measured 6 by the cooling unit 46 to a temperature below a room temperature, which is due to the increase in the temperature change At in the irradiated part (FIG. 13(b)).

The second to the ninth embodiment incorporate measures to improve the void detection sensitivity of the first embodiment in detecting the void through analysis under a nonbiased condition. Embodiments of the present invention effective in analyzing Al interconnection lines and via holes of practical LSI circuits will be described hereinafter.

Figure 15:
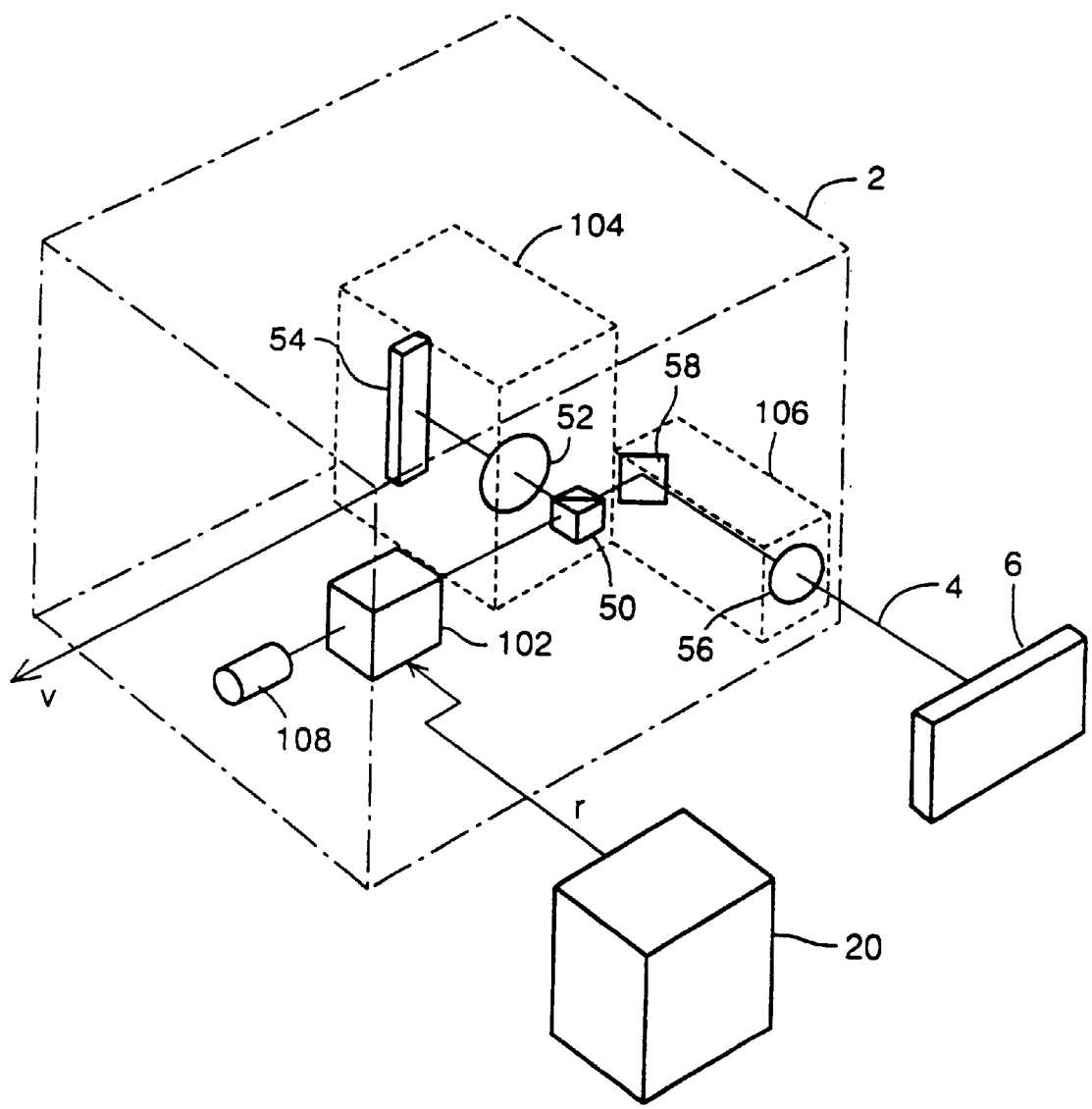
FIG. 15 is a schematic perspective view of a laser scanning microscope included in a scanning photoinduced current analyzer in an eleventh embodiment according to the present invention.

FIG. 15 is a block diagram of a laser scanning microscope 2 included in a scanning photoinduced current analyzer in an eleventh embodiment according to the present invention.

In this embodiment, the laser scanning microscope 2 is provided with a laser light source 100 in FIG. 22 that emits a laser beam of, for example, 1.2 μm or above in wavelength to prevent the photoinduction of current in the Si substrate so that voids formed in Al interconnection lines can be detected under a nonbiased condition. In a practical device, such as an LSI device, differing from a test specimen, some parts of the Al interconnection line is necessarily in contact with the Si substrate. The conventional laser scanning microscope uses a laser that emits a laser beam of 633 nm in wavelength, such as a He—Ne laser or a laser that emits a laser beam of 488 nm in wavelength, such as an Ar laser, and the energy of such a laser beam is higher than the band gap energy of Si, i.e., 1.1 eV corresponding to the wavelength of 1.2 μm of light. Therefore, when the laser beam falls on the Si substrate, electron-hole pairs are produced in the Si substrate and the electrons or the holes migrate into the Al interconnection line to induce a current. The photoinduced current on the order of microamperes induced in the Si substrate is far greater than a current on the order of nanoamperes induced in the Al interconnection line due to a void under the same condition. This photoinduced current induced in the Si substrate makes it difficult for the conventional scanning photoinduced current analyzer to analyze the practical device. This embodiment uses a laser beam 4 having a wavelength of 1.2 μm or above, which is smaller than the band gap energy of Si to prevent the production of electron-hole pairs in the Si substrate to eliminate the adverse effect of the photoinduced current induced in the Si substrate.

A solid-state laser employing a MgF2 crystal doped with Co or Ni is capable of emitting a laser beam of 1.2 μm or above in wavelength.

If the sample to be measured has a semiconductor substrate other than a Si substrate, a laser light source that emits a laser beam having energy lower than the band gap of the material forming the semiconductor substrate may be used for the same effect.

Although the eleventh embodiment uses the laser beam of a specific wavelength to eliminate the influence of the photoinduced current induced in the Si substrate, it is also possible to eliminate the photoinduced current induced in the Si substrate by irradiating only the Al interconnection lines with a laser beam.

Figure 16:
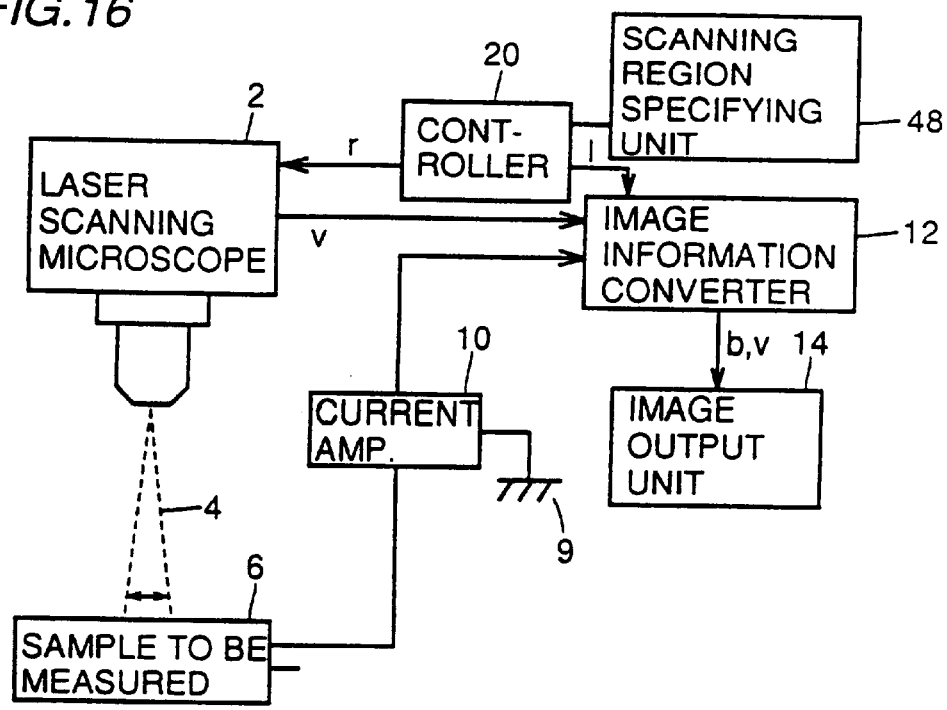
FIG. 16 is block diagram of a scanning photoinduced current analyzer in a twelfth embodiment according to the present invention.

FIG. 16 is a block diagram of a scanning photoinduced current analyzer in a twelfth embodiment according to the present invention. The scanning photoinduced current analyzer in the twelfth embodiment is different from the scanning photoinduced current analyzer in the first embodiment shown in FIG. 1 in that the former has a scanning region specifying unit 48.

A controller 20 receives the output signal of the scanning region specifying unit 48 and provides a scanning region specifying signal r to limit a region to be scanned with a laser beam emitted by a laser scanning microscope 2.

Figure 17:
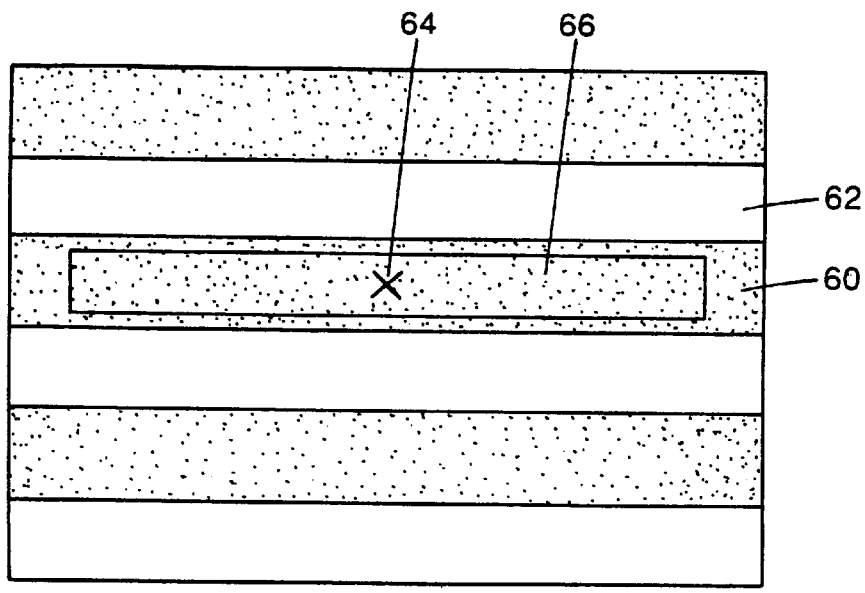
FIG. 17 is a pictorial view of an image for specifying a scanning region by the twelfth embodiment.

FIG. 17 shows image forming data provided by the scanning photoinduced current analyzer. A sample to be measured has Al interconnection lines 60 formed on a Si substrate and one of the Al interconnection lines 60 has a void 64. Only a given region on the Al interconnection line 60 is scanned with a laser beam 4. The scanning photoinduced current analyzer is provided with the scanning region specifying unit 48 that enables the specification of an optional scanning position and an optional scanning range on the screen of a monitor to irradiate only a region corresponding to the Al interconnection line 60 with the laser beam 4. Therefore, the adverse effect of a photoinduced current induced in the Si substrate can be reduced and the void formed in the Al interconnection line 60 can be detected at a high detection sensitivity.

Although the eleventh embodiment controls the position and range to be scanned with the laser beam 4 to acquire only information about the Al interconnection line, the position and region in which the current is to be detected may be specified for the same effect.

Figure 18:
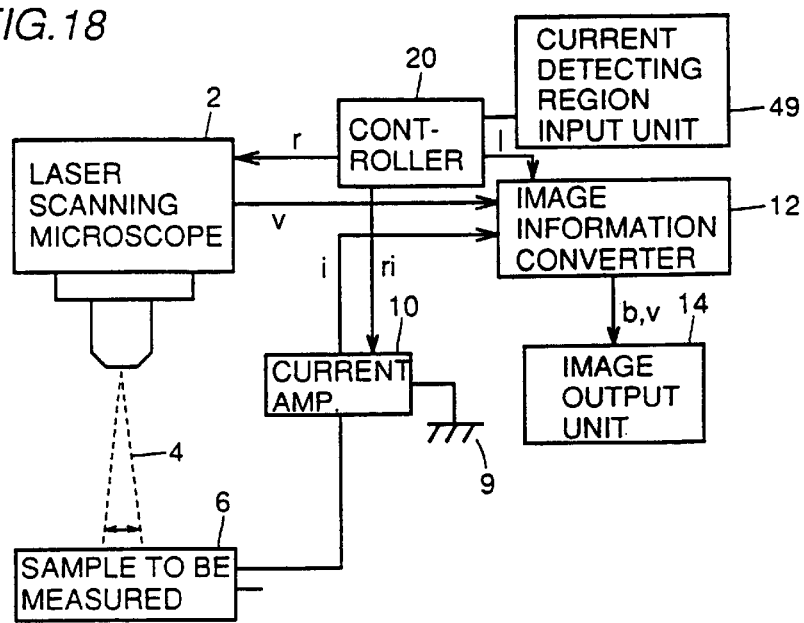
FIG. 18 is a block diagram of a scanning photoinduced current analyzer in a thirteenth embodiment according to the present invention.

FIG. 18 is a block diagram of a scanning photoinduced current analyzer in a thirteenth embodiment according to the present invention.

This scanning photoinduced current analyzer differs from the scanning photoinduced current analyzer in the first embodiment shown in FIG. 1 in that the former is provided with a current detecting region input unit 49.

A controller 20 provides a current detecting region specifying signal ri on the basis of an input signal given thereto from the current detecting region input unit 49 to specify are region in which the current is detected by a current amplifier 10.

Figure 19A:
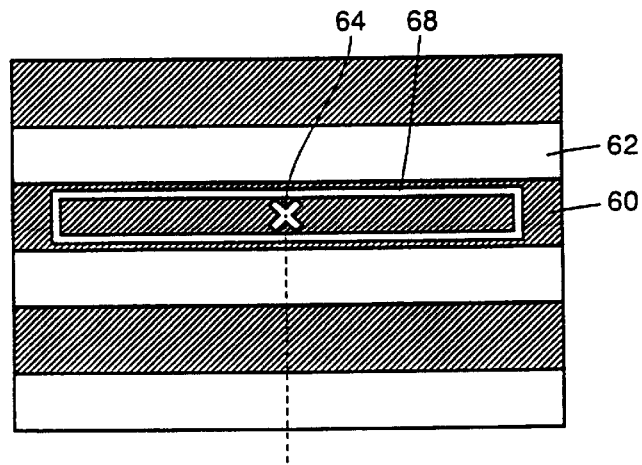
Figure 19B:
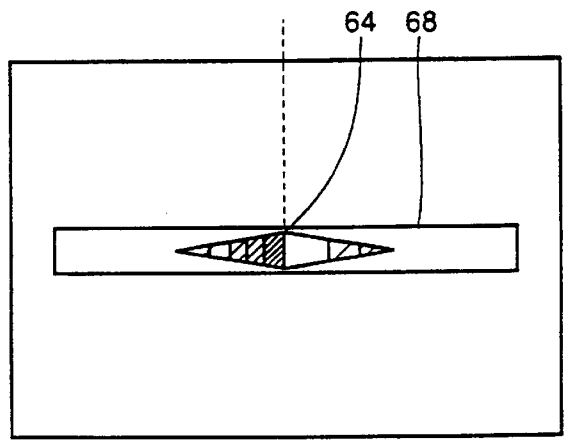

FIG. 19(a) shows an image for specifying a current detecting region and FIG. 19(b) shows a current image formed by detecting only a specified region on the Al interconnection line by the scanning photoinduced current analyzer in the thirteenth embodiment by way of example. The sample to be measured has the Al interconnection lines 60 formed on the Si substrate 62, and a void 64 is formed in one of the Al interconnection lines 60. The current amplifier 10 detects the photoinduced current only in a period in which the laser beam 4 scans the specified region 68 on the Al interconnection line 60. An image 70 of the void 64 is included in the current image.

The conventional scanning photoinduced current analyzer uses the mean current of currents detected by scanning a scanning region with a laser beam as a reference current, converts the differences of detected currents from the reference current into luminances, and provides, for example,. a current image in 256 gradations. Therefore, the conventional scanning photoinduced current analyzer displays regions corresponding to the Al interconnection lines in black and regions corresponding to the Si substrate in white as shown in FIG. 19(a) and any information about the Al interconnection lines is not displayed. Accordingly, the width of the range of variation of the current that can be expressed is reduced if the resolution is enhanced by raising the sensitivity of the current amplifier. Generally, a current variation of 1 nA or less must be detected to detect a void in the Al interconnection line. When a current amplifier having a lower detection limit (detecting resolution) of 40 pA is used, an expressible current range is as small as a value on the order of 10 nA. If the Si substrate is within the scanning region, the mean current in the scanning region is of the order of microamperes. If only the currents in a 10 nA range are converted into luminances, the luminance gradations of the Si substrate and those of the Al interconnection lines are limited by the upper limit and the lower limit, respectively, and the image of the Si substrate is white and that of the Al interconnection lines is black as shown in FIG. 19(a).

Since the scanning photoinduced current analyzer has a function to optionally specify are region for current detection or current-to-luminance conversion, the effect of the photoinduced current induced in the Si substrate can be eliminated, and voids formed in the Al interconnection lines of practical devices, such as LSI devices can be detected at a high detection sensitivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A scanning photoinduced current analyzer capable of detecting photoinduced current induced in a sample to be measured when the sample to be measured is scanned with a focused laser beam, said scanning photoinduced current analyzer comprising:

a laser light source that emits the laser beam;

scanning means for controlling the laser beam to scan a region specified by a first control signal;

focusing means for focusing the laser beam on the sample to be measured;

control means that provides the first control signal;

a source of reference potential for supplying a first potential;

current amplifying means connected between the source of reference potential and one end of the sample to be measured, an opposite end of the sample being open, to amplify the current flowing through the sample to be measured and to provide a signal corresponding to the amplified current;

image converting means for converting the output signal of the current amplifying means into image information in synchronism with the scanning operation of the laser beam and for providing the image information; and image output means for reconstructing an image represented by the image information.

2. A scanning photoinduced current analyzer according to claim 1, further comprising image forming means for forming an image of the reflected light reflected from the sample to be measured and supplying image forming information to the image converting means, said image converting means including switching means for selectively establishing a first state in which the image information is supplied to the image output means or a second state in which the image forming information is supplied to the image output means, according to a second control signal, wherein said control means provides the second control signal.

3. A scanning photoinduced current analyzer according to claim 1, further comprising a resistor connected to the open other end of the sample to be measured.

4. A scanning photoinduced current analyzer according to claim 1, further comprising a capacitor connected between the open end of the sample to be measured and the source of reference potential.

5. A scanning photoinduced current analyzer according to claim 1, said scanning means further including scanning speed varying means for varying the scanning speed of the laser beam.

6. A scanning photoinduced current analyzer according to claim 1, wherein, when the sample to be measured includes a semiconductor, the wavelength of the laser beam emitted by the laser light source is longer than a wavelength corresponding to the band gap energy of the semiconductor.

\* \* \* \* \*